(12) United States Patent
Ramirez et al.

(10) Patent No.: US 10,067,175 B2
(45) Date of Patent: Sep. 4, 2018

(54) DETERMINING BOND WIRE FAILURES

(71) Applicant: General Electric Company, Schenectady, NY (US)

(72) Inventors: Juan Diego Ramirez, Pittsburgh, PA (US); Robert Gregory Wagoner, Roanoke, VA (US)

(73) Assignee: General Electric Company, Schenectady, NY (US)

( * ) Notice: Subject to any disclaimer, the term of this patent is extended or adjusted under 35 U.S.C. 154(b) by 314 days.

(21) Appl. No.: 14/878,253

(22) Filed: Oct. 8, 2015

(65) Prior Publication Data

US 2017/0102421 A1    Apr. 13, 2017

(51) Int. Cl.
*G01R 31/02* (2006.01)
*G01R 31/40* (2014.01)

(52) U.S. Cl.
CPC ............ *G01R 31/021* (2013.01); *G01R 31/40* (2013.01)

(58) Field of Classification Search
CPC . H02M 1/32; H03K 2017/0806; H03K 17/08; H02P 29/02; H01L 2224/48472
See application file for complete search history.

(56) References Cited

U.S. PATENT DOCUMENTS

| | | |
|---|---|---|
| 5,650,336 A | 7/1997 | Eriguchi et al. |
| 5,877,419 A | 3/1999 | Farokhzad |
| 5,912,427 A * | 6/1999 | Willis ............... F42B 3/13 102/202.14 |
| 6,100,728 A | 8/2000 | Shreve et al. |
| 7,583,109 B2 | 9/2009 | Oughton, Jr. et al. |
| 7,826,985 B2 | 11/2010 | Weiss et al. |
| 8,148,929 B2 | 4/2012 | Wei et al. |
| 8,169,045 B2 | 5/2012 | Dibra et al. |
| 8,354,733 B2 | 1/2013 | Chang |
| 8,519,525 B2 | 8/2013 | Xue et al. |
| 8,547,687 B2 | 10/2013 | De Rijck et al. |
| 8,722,468 B2 | 5/2014 | Xue et al. |
| 8,766,394 B2 | 7/2014 | Dibra et al. |
| 2014/0103937 A1 | 4/2014 | Khan et al. |
| 2014/0125366 A1 | 5/2014 | Thogersen et al. |
| 2014/0212289 A1 | 7/2014 | Thogersen et al. |
| 2014/0247560 A1 | 9/2014 | Lemberg et al. |
| 2015/0041849 A1 | 2/2015 | Gillberg et al. |

FOREIGN PATENT DOCUMENTS

| | | |
|---|---|---|
| EP | 2 159 834 | 3/2010 |
| WO | WO 2012/142082 | 10/2012 |

* cited by examiner

*Primary Examiner* — Paresh Patel
(74) *Attorney, Agent, or Firm* — Dority & Manning, P.A.

(57) ABSTRACT

Systems and methods of determining bond wire failures are provided. In particular, data indicative of a first resistance of a first bond wire set associated with a first semiconductor device on a power semiconductor module can be obtained. In addition, data indicative of a second resistance of a second bond wire set associated with a second semiconductor device on the power semiconductor module can be obtained. A bond wire failure can then be determined in the first bond wire set or the second bond wire set based at least in part on the data indicative of the first resistance of the first bond wire set and the data indicative of the second resistance of the second bond wire set.

14 Claims, 6 Drawing Sheets

DETERMINING BOND WIRE FAILURES

FIELD OF THE INVENTION

The present disclosure relates generally to power converters, and more particularly to determining bond wire failures in a power converter.

BACKGROUND OF THE INVENTION

Power systems often include a power converter that is configured to convert direct current (DC) power into a suitable power for application to a load, such as a generator, motor, electrical grid, or other suitable load. For instance, a power generation system can include a power converter for producing alternating current (AC) power at a grid frequency (e.g. 60/50 Hz) suitable for application to an electrical grid. In solar or batter energy systems, the solar or battery source can provide direct current power to the power converter, which can then be converted to suitable AC output power for the electrical grid. In applications requiring AC to AC conversion, such as wind energy applications, the power converter can include two stages to provide AC to DC to AC conversion.

To provide increased output power capability, a power converter can include a plurality of bridge circuits coupled in parallel with one another. Each bridge circuit can include a plurality of switching elements (e.g. insulated gate bipolar transistors (IGBTs)). The pulse-width-modulation (PWM) of the switching elements can be controlled according to a desired switching pattern to provide a desired output of the power converter. Each switching element can further have an associated antiparallel diode.

The switching elements and antiparallel diodes can have a plurality of associated bond wires configured to couple the respective switching elements and antiparallel diodes to one or more other components on a power semiconductor module associated with the power converter. Such bond wires can become warn out over time due at least in part to variations in temperature associated with the power semiconductor module. In particular, such bond wires can rupture or lift off and become disconnected from the power semiconductor module, causing the remaining bond wires to dissipate heat.

Various techniques have been implemented for detecting bond wire failures. For instance, such conventional techniques include detection of variations in the collector-emitter voltage (Vice) of the associated IGBT to predict bond wire failure, detection of variations in parasitic gate capacitance of the IGBT to predict bond wire failure and other techniques. However, such techniques can be inefficient and/or difficult to implement.

BRIEF DESCRIPTION OF THE INVENTION

Aspects and advantages of the invention will be set forth in part in the following description, or may be obvious from the description, or may be learned through practice of the invention.

One example aspect of the present disclosure is directed to a control method of determining a bond wire failure on a power semiconductor module. The method includes obtaining data indicative of a first resistance of a first bond wire set associated with a first semiconductor device on a power semiconductor module. The method further includes obtaining data indicative of a second resistance of a second bond wire set associated with a second semiconductor device on the power semiconductor module. The method further includes determining a bond wire failure in the first bond wire set or the second bond wire set based at least in part on the data indicative of the first resistance of the first bond wire set and the data indicative of the second resistance of the second bond wire set.

Another example aspect of the present disclosure is directed to a power converter system. The power converter system includes a plurality of bridge circuits. Each of the plurality of bridge circuits includes a pair of switching elements coupled in series with one another, and a plurality of antiparallel diodes. Each antiparallel diode is associated with a switching element. Each switching element and antiparallel diode has one or more associated bond wires. The power converter system further includes a control system configured to determine one or more bond wire failures associated with the power converter system by obtaining data indicative of a first resistance of a first bond wire set associated with a first semiconductor device, and obtaining data indicative of a second resistance of a second bond wire set associated with a second semiconductor device. The second semiconductor device is coupled in parallel with the first semiconductor device. The control system is further configured to determine one or more bond wire failures associated with the power converter system by determining a bond wire failure in the first bond wire set or the second bond wire set based at least in part on the data indicative of the first resistance of the first bond wire set and the data indicative of the second resistance of the second bond wire set.

Yet another example aspect of the present disclosure is directed to a control system for determining one or more bond wire failures in a power converter system comprising a plurality of semiconductor device coupled in parallel. Each semiconductor device has one or more associated bond wires configured to couple at least a portion of the semiconductor device to a power semiconductor module. The control system includes one or more control circuits configured to obtain data indicative of a first resistance of a first bond wire set associated with a first semiconductor device, obtain data indicative of a second resistance of a second bond wire set associated with a second semiconductor device, and determine a bond wire failure in the first bond wire set or the second bond wire set based at least in part on the data indicative of the voltage across the first bond wire set and the data indicative of the voltage across the second bond wire set.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

DETAILED DESCRIPTION OF THE INVENTION

Figure 1:
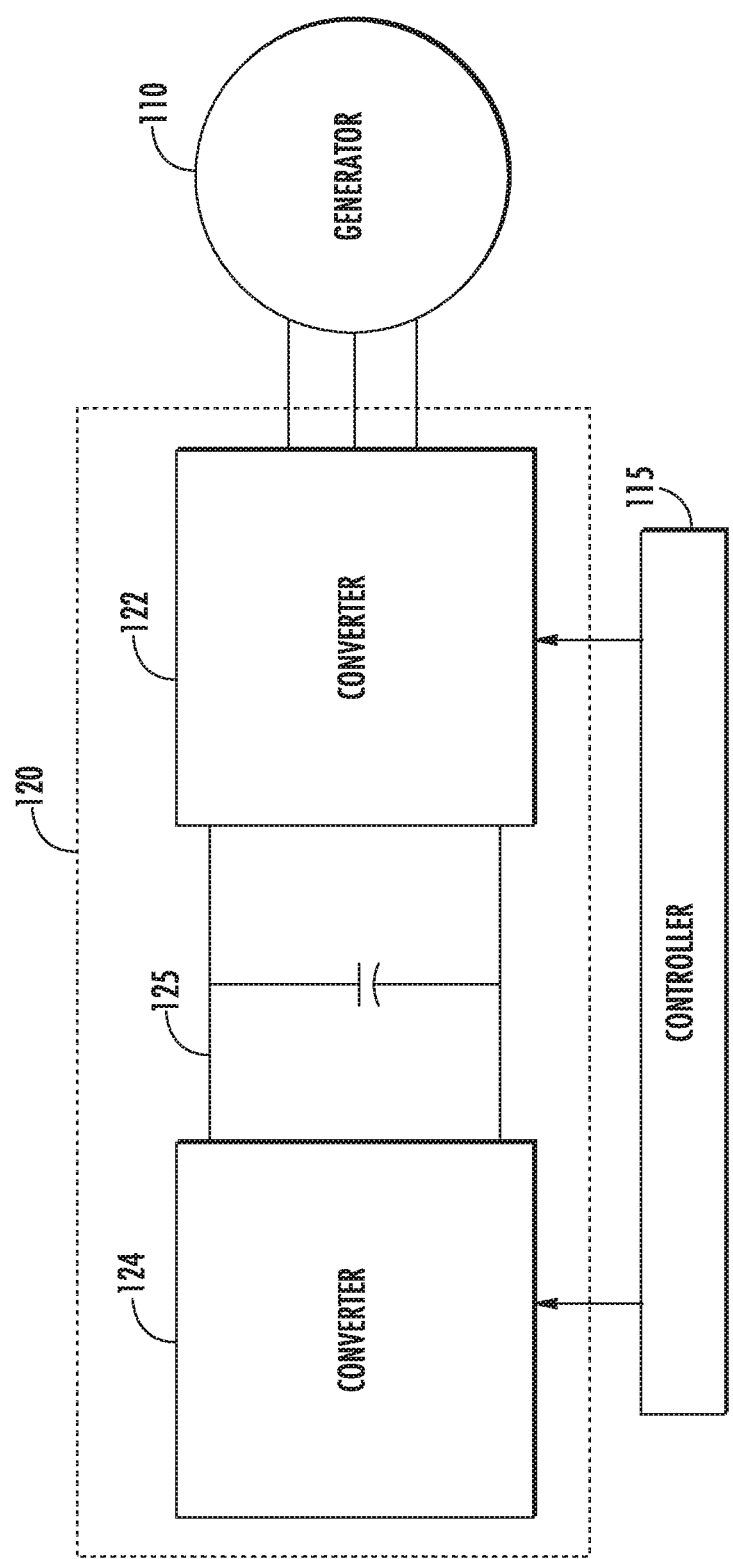
FIG. 1 depicts an overview of an example power converter system according to example embodiments of the present disclosure.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

Example aspects of the present disclosure are directed to determining bond wire failures. In particular, one or more sets of bond wires can be configured to couple one or more semiconductor devices on a power semiconductor module. For instance, the power semiconductor module can be used in a power converter of a wind turbine or other power system. A resistance can be measured for a first bond wire set and a second bond wire set associated with the power semiconductor module. If the difference between the resistances falls outside of a threshold range, a bond wire failure can be determined in the first bond wire set or the second bond wire set. Operation of the corresponding semiconductor device can then be controlled based at least in part on the detected bond wire failure.

More particularly, a power semiconductor module associated with a power converter can include a first bridge and a second bridge. The first bridge and the second bridge can each include one or more bridge circuits that include a plurality of switching elements coupled in series with one another. The switching elements can include insulated-gate bipolar transistors (IGBTs), metal-oxide-semiconductor field-effect transistors (MOSFETs), bipolar junction transistors (BJTs), and/or various other suitable power semiconductor devices. Each switching element can have an associated diode coupled in an antiparallel manner to the switching element.

As indicated above, each switching element and associated diode can have one or more sets of bond wires coupling the respective switching element or diode to the power semiconductor module. For instance, each switching element and associated diode can have a bond wire set associated with each terminal of the switching element or diode. According to a particular implementation of the present disclosure, in response to applying a current through the bond wire sets, a voltage drop across the bond wire sets can be measured, for instance, to determine a resistance of the bond wire sets. A difference between the resistances of a particular bond wire set and a corresponding bond wire set on a parallel bridge circuit can then be determined. The resistance difference can be compared against a threshold. If the difference exceeds the threshold, a bond wire failure can be determined. Responsive to determining a bond wire failure, operation of the switching elements can be ceased.

The power semiconductor module can be configured to receive an alternating current (AC) input. In such embodiments, each bridge circuit can be configured such that the switching elements and the antiparallel diodes conduct current in opposite directions. In particular, each bridge circuit can be configured such that the switching elements conduct current in one direction (e.g. during one or more positive half cycles of the AC current) and the antiparallel diodes conduct current in the opposite direction (e.g. during one or more negative half cycles of the AC current). In this manner, current will not be conducted by the switching elements while the diodes are conducting current, and current will not be conducted by the diodes while the switching elements are conducting current.

In a particular implementation, the voltage drop across a bond wire set can be measured during one or more periods of time during which the semiconductor device associated with the bond wire set is not conducting current. In this manner, during such time periods, a test current can be provided to the appropriate bond wire sets. A voltage can then be measured across the bond wire sets, for instance, using a kelvin connection technique. The voltage can be determined based at least in part on the test current. A resistance can then be determined for each of the bond wire sets. The resistances of the bond wire sets can then be compared to determine a bond wire failure according to example embodiments of the present disclosure. During the subsequent half cycle period of the AC current, the process can be repeated for the parallel semiconductor devices of the parallel bridge circuits. In other embodiments, resistance determinations can be performed during one or more half cycles of the alternating current in which the associated semiconductor devices are conducting current. For instance, in such other embodiments, a test current may not be applied to the bond wire sets, and the voltages across the bond wire sets (and thereby the resistances of the bond wire sets) can be determined based at least in part on the alternating current.

With reference now to the figures, example embodiments of the present disclosure will now be discussed in detail. For instance, FIG. 1 depicts a block diagram of an example power system 100 according to an example embodiment of the present disclosure. The power system includes a generator 110 configured to generate AC power and to provide the AC power to the power converter 120. The generator 110 can be a wind driven generator or other suitable generator. Those of ordinary skill in the art, using the disclosures provided herein, will understand that the power system 100 can be used with any type of load, such as a motor, generator, electrical grid, or other suitable load. In addition, while a generator is traditionally a supplier of electrical power, a generator can act as a load for purposes of the present disclosure.

The power converter 120 can be a two stage power converter and can include a converter 122 (i.e. DC to AC conversion stage), a converter 124, and a controller 115. The converter 122 and the converter 124 can be coupled together by a DC link 125. The present disclosure will be discussed with reference to a two-stage power converter system 100 for purposes of illustration and discussion. Those of ordinary skill in the art, using the disclosures provided herein, will understand that the control scheme according to aspects of the present disclosure is applicable to any suitable power converter system.

The converter 122 can receive multiphase (e.g. 3-phase) AC power from the generator 110 and can convert the AC power to DC power for application to the DC link 125. The converter 124 can be a DC to AC converter and can convert the DC power on the DC link 225 to a suitable output power for application to an electrical grid. For instance, the converter 124 can convert the DC power to multiphase (e.g. 3-phase) AC power at a grid frequency (e.g. 50/60 Hz) for application to an electrical grid.

The power converter 120 of FIG. 1 can be used in other power systems without deviating from the scope of the present disclosure. For instance, the power converter 120 can be used to convert DC power generated from a solar or battery storage system to suitable AC power for application to an electrical grid. In particular, the DC source (e.g. a photovoltaic array) can provide DC power to the converter 124. In this exemplary implementation, the converter 124 can be a boost converter, a buck converter, or a buck/boost converter used to provide DC power to the DC link 125. The converter 122 can convert the DC power on the DC link 125 to a suitable output power for application to an electric grid, such as a multiphase (e.g. 3-phase) AC power having a grid frequency (e.g. 50/60 Hz).

As will be discussed in more detail below, one or more of the converter 122 and the converter 124 of the power converter 120 can include a plurality of bridge circuits coupled in parallel. The plurality of bridge circuits coupled in parallel can provide increased output power capability of the power converter 120. Each of the plurality of bridge circuits can include at least one switching element. The controller 115 can send control commands to control pulse width modulation of the switching elements of the plurality of bridge circuits so that the power converter 120 provides a suitable output power.

The controller 115 can include any number of control devices. In one implementation, the controller 115 can include a processing device (e.g. microprocessor, microcontroller, etc.) executing computer-readable instructions stored in a computer-readable medium. The instructions when executed by the processing device can cause the processing device to perform operations, including providing control commands (e.g. pulse width modulation commands) to the switching elements of the power converter 120.

Figure 2:
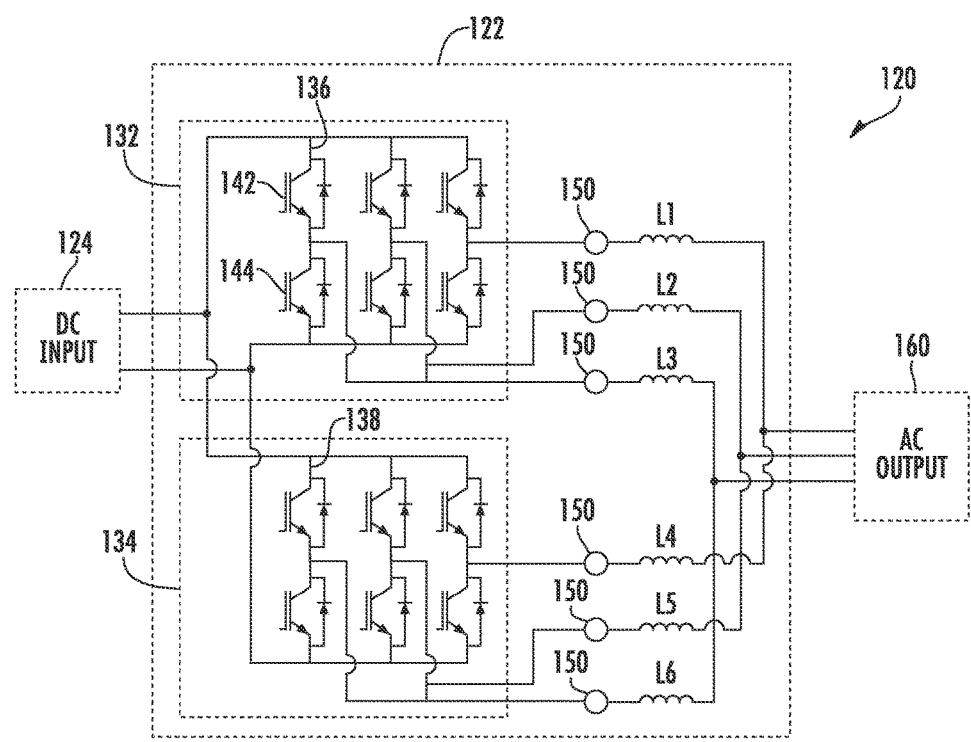
FIG. 2 depicts a circuit diagram of an example power converter system according to example embodiments of the present disclosure.

FIG. 2 depicts a circuit diagram of an exemplary converter 122 of a power converter 120 according to an exemplary embodiment of the present disclosure. As shown, the converter 122 can receive a DC input, for instance, from the DC link 125 or other DC input and can provide an AC output 160. The terms "input" and "output" are used herein for purposes of illustration and discussion. Those of ordinary skill in the art, using the disclosures provided herein, will understand that the input and output of the converter 122 can vary depending on the power flow of the power system. Thus, the DC input can also serve as an output of the system and the AC output can also serve as an input of the system.

The converter 122 can include a first bridge 132 and a second bridge 134. First bridge 132 and second bridge 134 can be implemented, for instance, as IGBT power semiconductor modules. Each bridge 132 and 134 can include a bridge circuit for each phase (e.g. each of three phases) of the power converter 120. For instance, first bridge 132 includes a bridge circuit 136 for a phase of the first bridge 132. Second bridge 134 can include a bridge circuit 138 for a phase of the second bridge 134. The first bridge 132 and the second bridge 134 can be paralleled together such that the bridge circuit 136 is coupled in parallel with the bridge circuit 138. In this manner, the power converter 120 can include a set of a plurality of bridge circuits coupled in parallel for each phase of the power converter 120. Using parallel bridge circuits can increase the output power capability of the power converter 120.

Each bridge circuit includes a plurality of switching elements (e.g. IGBTs) coupled in series with one another. For instance, each bridge circuit includes an upper IGBT (e.g. IGBT 142) and a lower IGBT (e.g. IGBT 144). It will be appreciated by those of ordinary skill in the art that other suitable switching elements can be used in place of IGBTs, such as MOSFETs or other suitable switching elements. A diode is coupled in parallel with each of the IGBTs. Each bridge circuit can provide a bridge output at a node between the plurality of switching elements coupled in series. The power converter 120 can include current sensors 150, such as current shunts or other suitable sensors, which are used to monitor the bridge current of the plurality of bridge circuits.

The bridge circuits of the power converter 120 are controlled, for instance, by providing control commands, using a suitable driver circuit, to the gates of the IGBTs. For example, a controller (e.g. controller 115 of FIG. 1) can provide suitable gate timing commands to the gates of the IGBTs of the bridge circuits. The control commands can control the pulse width modulation of the IGBTs to provide a desired output. The parallel bridge circuits, such as parallel bridge circuits 136 and 138, can be controlled according to any suitable switching pattern, such as according to an interleaved switching pattern or a non-interleaved switching pattern.

As illustrated, the bridge output of each bridge circuit includes an output inductor L1-L6. The output inductors L1-L6 can be used to filter high frequency components of the output power generated by the power converter 120. The output inductors L1-L6 can be built as three-phase components (e.g. wound on a single magnetic core with a separate magnetic path for each phase) such that L1-L3 are built on a single core and L4-L6 are built on a single core. The output inductors L1-L6 are effectively coupled between the parallel bridge circuits. For example, output inductors L3 and L6 are effectively coupled between the parallel bridge circuits 136 and 138.

Figure 3:
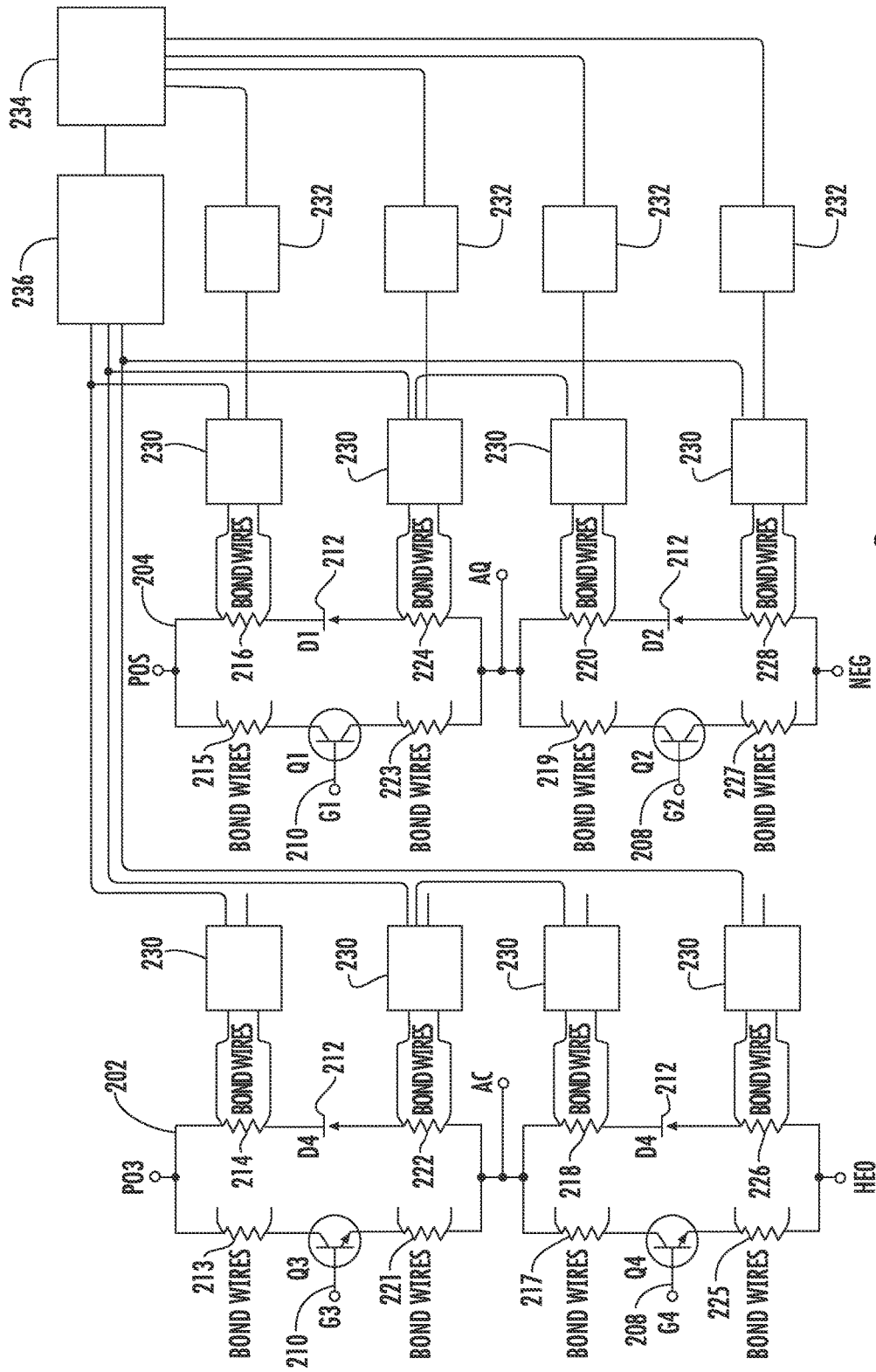
FIG. 3 depicts a circuit diagram of an example power semiconductor module according to example embodiments of the present disclosure.

FIG. 3 depicts an overview of at least a portion of an example power semiconductor module 200 according to example embodiments of the present disclosure. Power semiconductor module 200 can correspond to at least a portion of converter 122 and/or converter 124 of FIGS. 1 and 2. In particular, FIG. 3 depicts bridge circuits 202 and 204. Bridge circuits 202 and 204 can both be included on power semiconductor module 200. Each bridge circuit 202, 204 includes a lower switching element 208 and an upper switching element 210. Each switching element has an associated antiparallel diode 212. Each switching element and each diode have associated bond wire sets configured to couple each respective switching elements or diode to power semiconductor module 200. In particular, each switching element and diode has associated upper bond wire sets 213-220 and associated lower bond wire sets 221-228.

As shown, each bridge circuit 202, 204 is configured to receive an AC input. In this manner, the current flowing through the bond wire sets 213-228 depends on the direction of current flow. In particular, when diodes 212 are conducting current, current will flow through the bond wire sets associated with the diodes 212 (e.g. bond wire sets 214, 216, 218, 220, 222, 224, 226, and 228). Accordingly, when switching elements 210 are conducting current, current will flow through the bond wire sets associated with the switching elements 210 and 212 (e.g. bond wire sets 213, 215, 217, 219, 221, 223, 225, and 227).

When current flows through a bond wire set, a voltage drop is created across the bond wire set. A voltage difference between the voltage drop across the bond wire set and the voltage drop across a corresponding bond wire set on a parallel bridge circuit can be determined. As used herein, corresponding bond wire sets can be bond wire sets associated with corresponding semiconductor device terminals in corresponding bridge circuits on power semiconductor module 200. For instance, bond wire sets 214 and 216 can be corresponding bond wire sets. In this manner, during one or more periods of time in which diodes 210 conduct current, a voltage drop can be measured across bond wire set 214 of bridge circuit 202. A voltage drop can also be measured across bond wire set 216 of bridge circuit 204. The voltage drops can be determined based at least in part on the AC input. In such embodiments, the voltage drops across corresponding bond wire sets can be monitored continuously, or only during one or more time periods in which the associated semiconductor device is conducting current. A voltage difference can then be determined between the two voltage drops. The voltage difference can be compared to a voltage threshold. If the voltage difference exceeds the voltage threshold, a bond wire failure can be determined in power semiconductor module 200.

In alternative embodiments, bond wire failure on power semiconductor module 200 can be determined during one or more periods of time during which current is not flowing through the bond wire set. For instance, during the one or more periods of time in which current is not flowing through the bond wire set, a test current can be provided to the bond wire set by an isolated power supply, and a resistance of the bond wire set can be determined. In this regard, power semiconductor module 200 further includes resistance sensors 230 and isolation circuits 232. Although FIG. 3 depicts only a portion of bond wire sets 213-228 having associated resistance sensors 230 and/or isolation circuits 232, this is for illustrative purposes only. In fact, it will be appreciated that any suitable number of bond wire sets associated with power semiconductor module 200 may have associated resistance sensors 230 and/or isolation circuits 232.

In particular implementations, an isolated power supply 236 can be configured to provide a test current to the associated bond wire set for at least one or more periods of time during which the semiconductor device (e.g. switching element 210 or diode 212) is not conducting current provided by the AC input. Operation of the isolated power supply 236 can be controlled by a controller 234. In particular, controller 234 can provide one or more control commands to power supply 236 causing power supply 236 to provide a test current to the associated bond wire sets. Such test current provided by the isolated power supply 236 can be used to determine a voltage drop across the bond wire sets while current from the AC input is not flowing through the bond wire sets. The voltage drop can be determined, for instance, using a kelvin connection technique. A resistance of the bond wire set can be determined at least in part from the determined voltage drop. For instance, the resistance can be determined by resistance sensor 230, and provided to controller 234 through an isolated output circuit 232. The resistance can then be compared to a resistance of a corresponding bond wire set to determine if the resistance falls outside of a predetermined threshold window. If the resistance does fall outside of such window, a bond wire failure can be determined.

Figure 4:
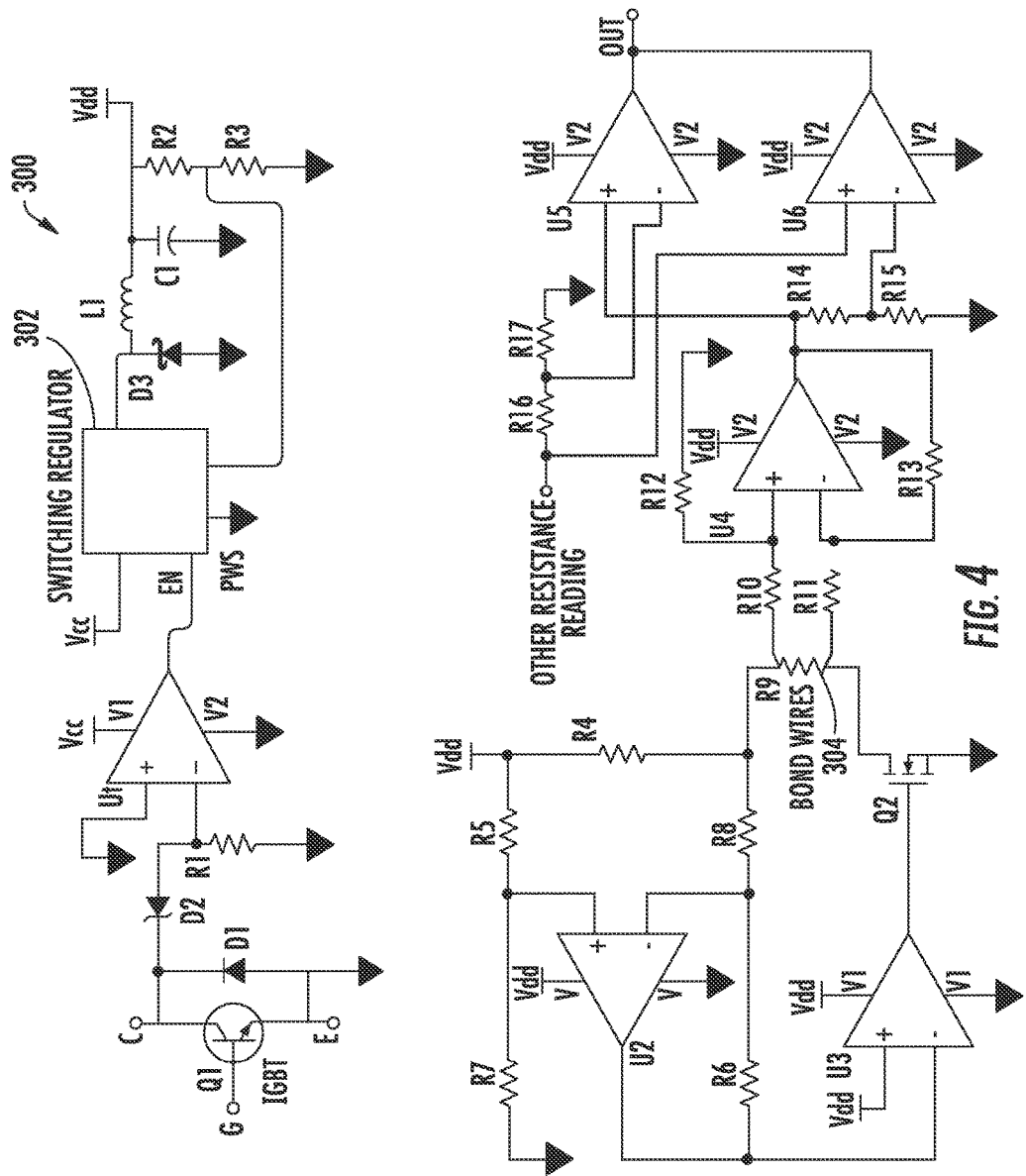
FIG. 4 depicts a diagram of example circuitry for determining bond wire failures according to example embodiments of the present disclosure.

In example embodiments, a test current can be provided by an isolated power supply 232 to an associated bond wire set only during one or more periods of time in which the associated component is not conducting current. For instance, FIG. 4 depicts a schematic of an example circuit configuration 300 for providing a test current to a bond wire set 304 while the associated semiconductor device is not conducting current. In particular, a switching regulator 302 can be configured to determine whether the AC input is currently on a positive or negative half cycle based at least in part on the voltage drop of diode D1 (and thereby, whether the diode D1 or IGBT Q1 is presently conducting current). Switching regulator 302 can then be configured to enable a test current pulse to bond wire set 304 based at least in part on the current half cycle (e.g. positive or negative) of the AC input.

Figure 5:
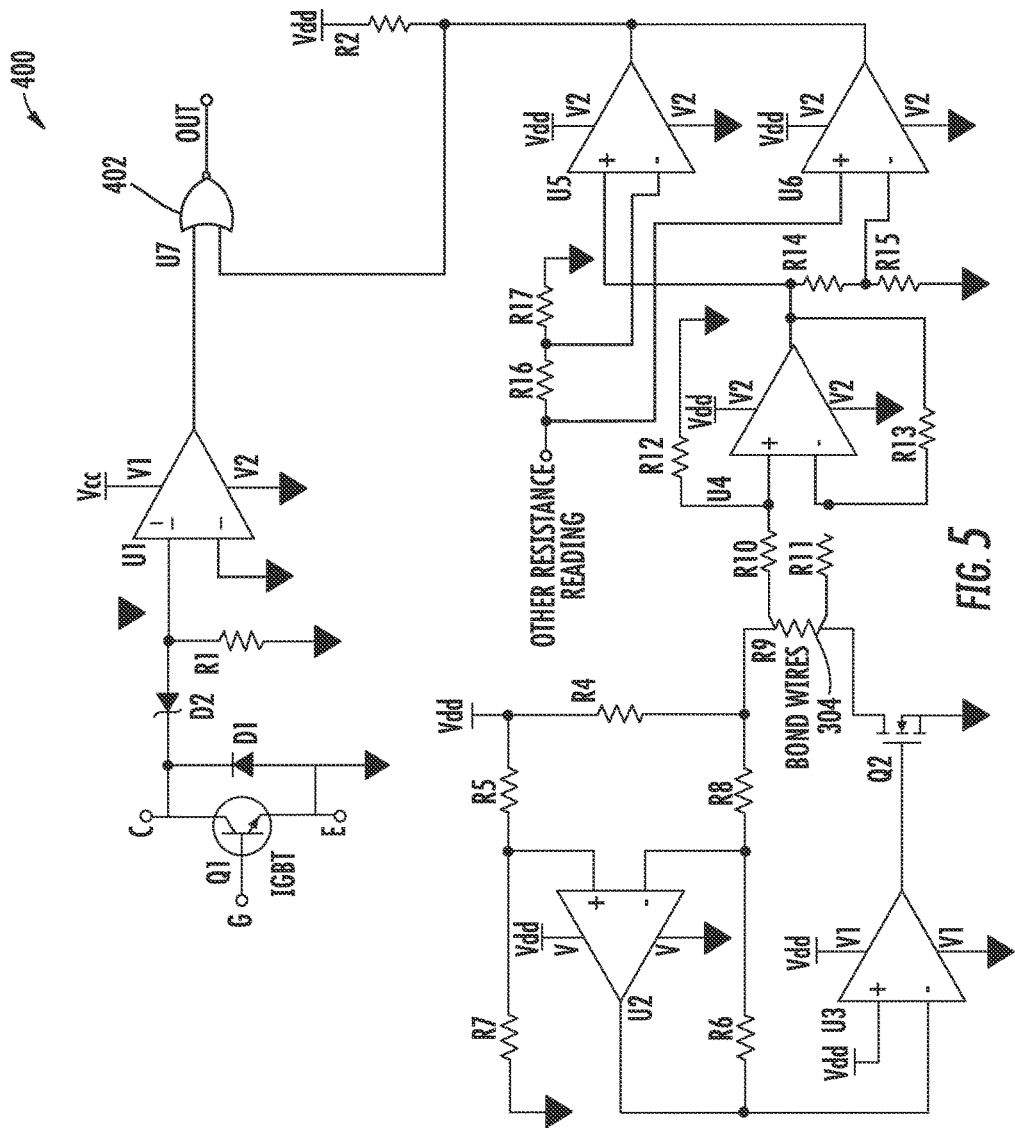
FIG. 5 depicts a diagram of example circuitry for determining bond wire failures according to example embodiments of the present disclosure.

In alternative embodiments, a continuous test current can be provided to the bond wire sets. In such embodiments a logic enable device can be configured to supersede the output of resistance comparison when the corresponding component is conducting current provided by the AC input. For instance, FIG. 5 depicts a schematic of an example circuit configuration 400 for providing a continuous current to a bond wire set 404. In particular, a logic enable device 402 can be provided at the output of circuit configuration 400. A continuous current can be supplied to bond wire set 404. As shown, the resistance of bond wire set 404 can be compared to a resistance of a corresponding bond wire set. The output can be fed into logic enable device 402 to provide a signal indicative of a bond wire set failure during one or more periods of time in which current is not conducted by the component associated with bond wire set 404.

Figure 6:
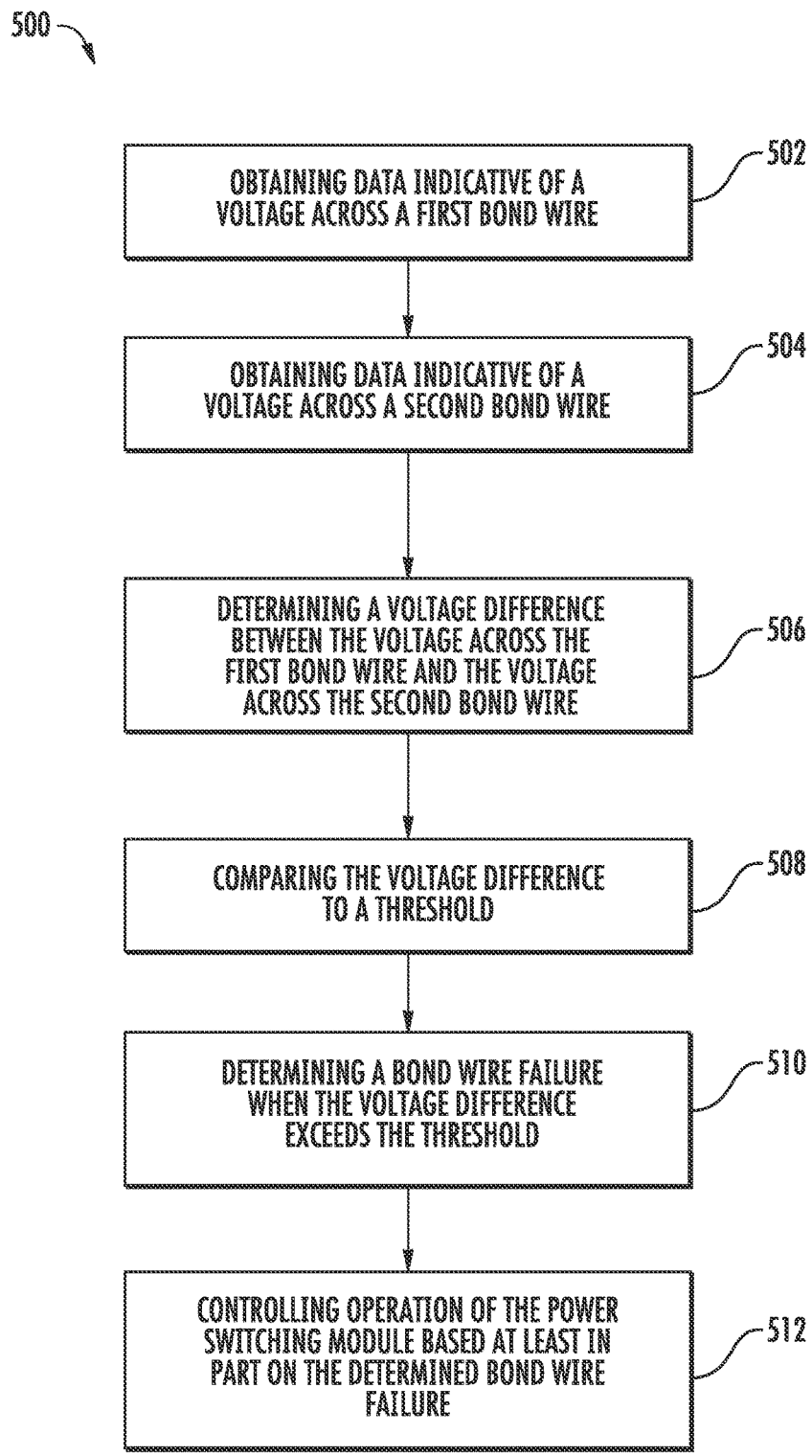
FIG. 6 depicts a flow diagram of an example method of determining bond wire failures according to example embodiments of the present disclosure.

FIG. 6 depicts a flow diagram of an example method (500) of determining a bond wire failure. Method (500) can be implemented by one or more computing devices, such as one or more of the computing devices depicted in FIG. 3. In addition, FIG. 6 depicts steps performed in a particular order for purposes of illustration and discussion. Those of ordinary skill in the art, using the disclosures provided herein, will understand that the steps of any of the methods discussed herein can be adapted, rearranged, expanded, omitted, or modified in various ways without deviating from the scope of the present disclosure.

At (502), method (500) can include obtaining data indicative of a voltage drop across a first bond wire set. At (504), method (500) can include obtaining data indicative of a voltage across a second bond wire set. The first and second bond wire sets can each be configured to couple at least a portion of a semiconductor device to one or more other components on a power semiconductor module for use in a power converter. For instance, the first bond wire set can be associated with a terminal of a first semiconductor device to the power semiconductor module, and the second bond wire set can be associated with the equivalent terminal of a second semiconductor device of the same type to the power semiconductor module. The first and second semiconductor devices can be, for instance, switching elements or diodes included in bridge circuits coupled in parallel. As indicated above the bridge circuits can be associated with a power converter for use in a power system.

In example embodiments, the voltage drops across the first and second bond wire sets can be determined using a current from an AC input. The first and second semiconductor devices can be configured to only conduct current in one direction. The first and second semiconductor devices can be configured such that they conduct current during the same half cycles of the AC input. In this manner, when the AC input is flowing in the opposite direction, the first and second semiconductor devices will not conduct current. In such embodiments, the voltage drop across the first and second bond wire sets can be determined at least during one or more half cycles of the AC input in which the first and second semiconductor devices are conducting current. The voltage drops can be determined using various suitable voltage sensing techniques.

In alternative embodiments, the voltage drop can be determined during one or more time period in which the first and second semiconductor devices are not conducting current (e.g. current from the AC input is not flowing through the first and second bond wire sets). In such embodiments, a test current can be provided to the bond wire sets for at least one or more periods of time in which the first and second semiconductor devices are not conducting current provided by the AC input. A voltage drop can be determined across the first and second bond wire sets based at least in part on the test current.

In example embodiments, the test current can be provided to the first and second bond wire sets only during one or more of the periods of time in which the first and second semiconductor devices are not conducting current. In alternative embodiments, the test current can be provided to the bond wire sets continuously during one or more periods in which the first and second semiconductor devices are conducting current and during one or more periods in which the first and second semiconductor devices are not conducting current.

At (506), method (500) can include determining a voltage difference between the voltage drop across the first bond wire set and the voltage drop across the second bond wire set. In alternative embodiments, the voltage drops can be used to determine a resistance of the first bond wire set and a resistance of the second bond wire set. A difference between the two resistances can then be determined.

At (508), method (500) can include comparing the determined voltage difference to a threshold voltage. In example embodiments, the voltage threshold can be a voltage range. In embodiments wherein a resistance difference is determined, the resistance difference can be compared to a resistance threshold. The voltage and/or resistance thresholds can be determined based at least in part on the rated current of the first and second semiconductor devices.

At (510), method (500) can include determining a bond wire failure when the voltage difference exceeds the threshold. In embodiments wherein the voltage threshold is a voltage range, a bond wire failure can be determined when the voltage difference falls outside of the voltage range. For instance, a bond wire failure can be determined for the bond wire set having the higher voltage and/or resistance. It will be appreciated that a bond wire failure can be determined using any suitable technique or algorithm. At (512), method (500) can include controlling operation of the power semiconductor module based at least in part on the determined bond wire failure. For instance, responsive to determining a bond wire failure, operation of one or more of the switching elements on the power semiconductor module can be ceased. In example embodiments, operation of the entire power semiconductor module can be ceased in response to detecting a bond wire failure.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A control method of determining a bond wire failure on a power semiconductor module, the method comprising:
    obtaining, by one or more control circuits, data indicative of a first resistance of a first bond wire set associated with a first semiconductor device on a power semiconductor module, wherein the data indicative of the first resistance is a voltage across the first bond wire set;
    obtaining, by the one or more control circuits, data indicative of a second resistance of a second bond wire set associated with a second semiconductor device on the power semiconductor module, wherein the data indicative of the second resistance is a voltage across the second bond wire set;
    determining, by the one or more control circuits, a voltage difference between the voltage across the first bond wire set and the voltage across the second bond wire set;
    comparing, by the one or more control circuits, the voltage difference to a voltage threshold;
    when the voltage difference exceeds the voltage threshold, determining a bond wire failure has occurred in the first bond wire set when the voltage across the first bond wire set is higher than the voltage across the second bond wire set; and
    controlling, by the one or more control circuits, the power semiconductor module based at least in part on the determined bond wire failure.

2. The control method of claim 1, wherein the first semiconductor device and the second semiconductor device are switching elements coupled in parallel.

3. The control method of claim 2, wherein the switching elements comprise power semiconductor devices.

4. The control method of claim 1, wherein determining a bond wire failure in the first bond wire set or the second bond wire set comprises determining a difference between the resistance of the first bond wire set and the resistance of the second bond wire set.

5. The control method of claim 1, wherein obtaining data indicative of a first resistance comprises providing a test current to the first bond wire set during one or more half cycles of an alternating current input in which the first semiconductor device is not conducting current from the alternating current input.

6. The control method of claim 5, wherein the data indicative of the voltage across the first bond wire set is obtained based at least in part on the test current.

7. The control method of claim 5, wherein obtaining data indicative of a second resistance comprises providing a test current to the second bond wire set during one or more half cycles of the alternating current input in which the second semiconductor device is not conducting current from the alternating current input.

8. The control method of claim 7, wherein the data indicative of the voltage across the second bond wire set is obtained based at least in part on the test current.

9. The control method of claim 1, wherein the data indicative of the first resistance is obtained during one or more half cycle periods of an alternating current input in which the first semiconductor device is conducting current from the alternating current input.

10. The control method of claim 9, wherein the data indicative of the second resistance is obtained during one or more half cycle periods of the alternating current input in which the second semiconductor device is conducting current from the alternating current input.

11. A power converter system comprising:
a plurality of bridge circuits, each of the plurality of bridge circuits comprising a pair of switching elements coupled in series with one another, and a plurality of antiparallel diodes, each antiparallel diode being associated with a switching element, wherein each switching element and antiparallel diode have one or more associated bond wire sets; and
a control system configured to determine one or more bond wire failures associated with the power converter system by:
   obtaining data indicative of a first resistance of a first bond wire set associated with a first semiconductor device on a power semiconductor module, wherein the data indicative of the first resistance is a voltage across the first bond wire set;
   obtaining data indicative of a second resistance of a second bond wire set associated with a second semiconductor device on the power semiconductor module, wherein the data indicative of the second resistance is a voltage across the second bond wire set;
   determining a voltage difference between the voltage across the first bond wire set and the voltage across the second bond wire set;
   comparing the voltage difference to a voltage threshold;
   when the voltage difference exceeds the voltage threshold, determining a bond wire failure has occurred in the first bond wire set when the voltage across the first bond wire set is higher than the voltage across the second bond wire set; and
   controlling the power semiconductor module based at least in part on the determined bond wire failure.

12. The power converter system of claim 11, wherein determining a bond wire failure in the first bond wire set or the second bond wire set comprises providing a test current to the first bond wire set during one or more periods of time in which the first semiconductor device is not conducting current from an alternating current input.

13. The power converter system of claim 11, wherein determining a bond wire failure in the first bond wire set or the second bond wire set comprises comparing the data indicative of the first resistance and the data indicative of the second resistance to a threshold.

14. A control system for determining one or more bond wire failures in a power converter system comprising a plurality of semiconductor device coupled in parallel, each semiconductor device having one or more associated bond wire sets configured to couple at least a portion of the semiconductor device to a power semiconductor module, the control system comprising one or more control circuits configured to:
   obtaining data indicative of a first resistance of a first bond wire set associated with a first semiconductor device on a power semiconductor module, wherein the data indicative of the first resistance is a voltage across the first bond wire set;
   obtaining data indicative of a second resistance of a second bond wire set associated with a second semiconductor device on the power semiconductor module, wherein the data indicative of the second resistance is a voltage across the second bond wire set;
   determining a voltage difference between the voltage across the first bond wire set and the voltage across the second bond wire set;
   comparing the voltage difference to a voltage threshold;
   when the voltage difference exceeds the voltage threshold, determining a bond wire failure has occurred in the first bond wire set when the voltage across the first bond wire set is higher than the voltage across the second bond wire set; and
   controlling the power semiconductor module based at least in part on the determined bond wire failure.

* * * * *